United States Patent
Park et al.

(10) Patent No.: US 9,763,368 B2
(45) Date of Patent: Sep. 12, 2017

(54) DISPLAY DEVICE

(71) Applicant: SAMSUNG DISPLAY CO., LTD., Yongin-si, Gyeonggi-do (KR)

(72) Inventors: Hyunsang Park, Suwon-si (KR); Sunggi Kim, Seoul (KR); Jinmin Chung, Yongin-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 68 days.

(21) Appl. No.: 14/839,689

(22) Filed: Aug. 28, 2015

(65) Prior Publication Data

US 2016/0227678 A1 Aug. 4, 2016

(30) Foreign Application Priority Data

Feb. 3, 2015 (KR) .......... 10-2015-0016841

(51) Int. Cl.
*H05K 7/20* (2006.01)

(52) U.S. Cl.
CPC .............. *H05K 7/20963* (2013.01)

(58) Field of Classification Search
CPC ......... H05K 7/20; H05K 7/20963; H05K 5/00
USPC ...................................................... 361/715
See application file for complete search history.

(56) References Cited

U.S. PATENT DOCUMENTS

| | | | |
|---|---|---|---|
| 5,831,374 A | 11/1998 | Morita et al. | |
| 6,604,457 B2 | 8/2003 | Klug | |
| 7,443,678 B2 * | 10/2008 | Han | F21K 9/00 |
| | | | 165/104.33 |
| 2009/0008770 A1 * | 1/2009 | Hasegawa | H01L 23/373 |
| | | | 257/712 |
| 2014/0118910 A1 * | 5/2014 | Sung | G09F 9/301 |
| | | | 361/679.01 |
| 2014/0353623 A1 | 12/2014 | Yi et al. | |
| 2015/0189789 A1 | 7/2015 | Suh | |
| 2016/0309598 A1 * | 10/2016 | Yamaguchi | G09F 9/30 |

FOREIGN PATENT DOCUMENTS

| | | | | |
|---|---|---|---|---|
| JP | 2002-284514 A | 10/2002 | | |
| KR | 10-1425596 B1 | 8/2014 | | |
| KR | 10-2014-0141330 A | 12/2014 | | |
| KR | 10-2015-0077673 A | 7/2015 | | |
| WO | WO 2010004662 A1 * | 1/2010 | ......... | H01L 23/3735 |

* cited by examiner

*Primary Examiner* — Dion R Ferguson
*Assistant Examiner* — Mandeep S Buttar
(74) *Attorney, Agent, or Firm* — Knobbe, Martens, Olson & Bear, LLP

(57) ABSTRACT

A display device comprises a display panel having a curved shape; a bottom case accommodating the display panel; and a heat dissipation plate disposed between the display panel and the bottom case, and comprising a first groove disposed on at least one surface thereof, wherein the first groove extends in an extending direction intersecting a curved side of the display panel.

19 Claims, 7 Drawing Sheets

DISPLAY DEVICE

CROSS-REFERENCE TO RELATED APPLICATION

This application claims priority to and the benefit of Korean Patent Application No. 10-2015-0016841, filed on Feb. 3, 2015, with the Korean Intellectual Property Office, the disclosure of which is incorporated herein in its entirety by reference.

BACKGROUND

1. Field

The present disclosure relates to a display device with a heat dissipation plate.

2. Discussion of the Related Technology

A liquid crystal display (LCD) device and an organic light emitting diode (OLED) display device are types of flat panel display (FPD) devices which have found wide recent acceptance.

With the use of an FPD device as a display device in a television receiver, a size of a screen of an FPD device is being increased. Due to such an increase in a size of a screen of an FPD device, a difference in an angle of view may occur between cases in which viewers watch a center of a screen and both ends of the screen.

In order to compensate for such a difference in an angle of view, a curved display device having both ends positioned higher than a center of a display unit has been recently developed.

Such curved display devices are classified into types, based on a viewer, including a portrait-type display device having a width greater than a length thereof and curved in a width direction thereof, and a landscape-type display device having a length greater than a width thereof and curved in a length direction thereof.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention provide a display device enabling accurate contact between a heat dissipation plate and a display panel.

According to an embodiment of the present invention, a display device includes: a display panel having a curved shape; a bottom case accommodating the display panel; and a heat dissipation plate disposed between the display panel and the bottom case, and comprising a first groove disposed on at least one surface thereof, wherein the first groove extends in an extending direction intersecting a curved side of the display panel.

The first groove extends in the direction which is substantially perpendicular to the curved side of the display panel.

The first groove is disposed on a one surface of the heat dissipation plate, the one surface having a radius greater than that of the other surface of the heat dissipation plate.

The heat dissipation plate has a second groove disposed at a curved side of the heat dissipation plate.

The display device may further include: a light detector disposed at the curved side of the display panel; and a connector interconnecting the light detector and a printed circuit board (PCB), the connector comprising a portion disposed in the second groove.

The heat dissipation plate may include: a third groove disposed on at least one surface of the heat dissipation plate; and a hole disposed in the third groove and penetrating through the heat dissipation plate.

The third and first grooves are disposed on the same surface of the heat dissipation plate.

The display device may further include a temperature detector inserted into the third groove.

The display device may further include a first adhesive member disposed between the third groove and the temperature detector.

The first adhesive member may be a double-sided tape.

The display device may further include a second adhesive member disposed between the temperature detector and the heat dissipation plate.

The second adhesive member may be a tape.

The heat dissipation plate has a fourth groove disposed on at least one surface of the heat dissipation plate, wherein the display device further comprises a signal transmission line disposed in the fourth groove and interconnecting the temperature detector and the PCB.

The fourth groove and the first groove are disposed on the same surface of the heat dissipation plate.

The heat dissipation plate may include: a first protection layer; an adhesive layer disposed between the first protection layer and the display panel; a second protection layer; and a heat dissipation layer disposed between the second protection layer and the first protection layer.

The heat dissipation plate may further include: a first adhesive interlayer disposed between the first protection layer and the heat dissipation layer; and a second adhesive interlayer disposed between the second protection layer and the heat dissipation layer.

The heat dissipation layer may be formed of graphite.

The at least one first groove includes a one first groove on a one surface of the heat dissipation plate and another first groove on another surface of the heat dissipation plate, wherein the one first groove and another first groove overlap each other.

The at least one first groove linearly extends along the extending direction substantially perpendicular to the curved side of the display panel, wherein the at least one first groove extends throughout a distance between two curved sides of the heat dissipation plate without connection to any other first groove extending in a direction different from the extending direction.

The at least one first groove linearly extends along the extending direction substantially perpendicular to the curved side of the display panel, wherein the first groove has a length greater than about 75% of a distance between curved sides of the heat dissipation plate without connection to any other first groove extending in a direction different from the extending direction.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present invention will be more clearly understood from the following detailed description taken in conjunction with the accompanying drawings, in which.

DETAILED DESCRIPTION

Figure 1:
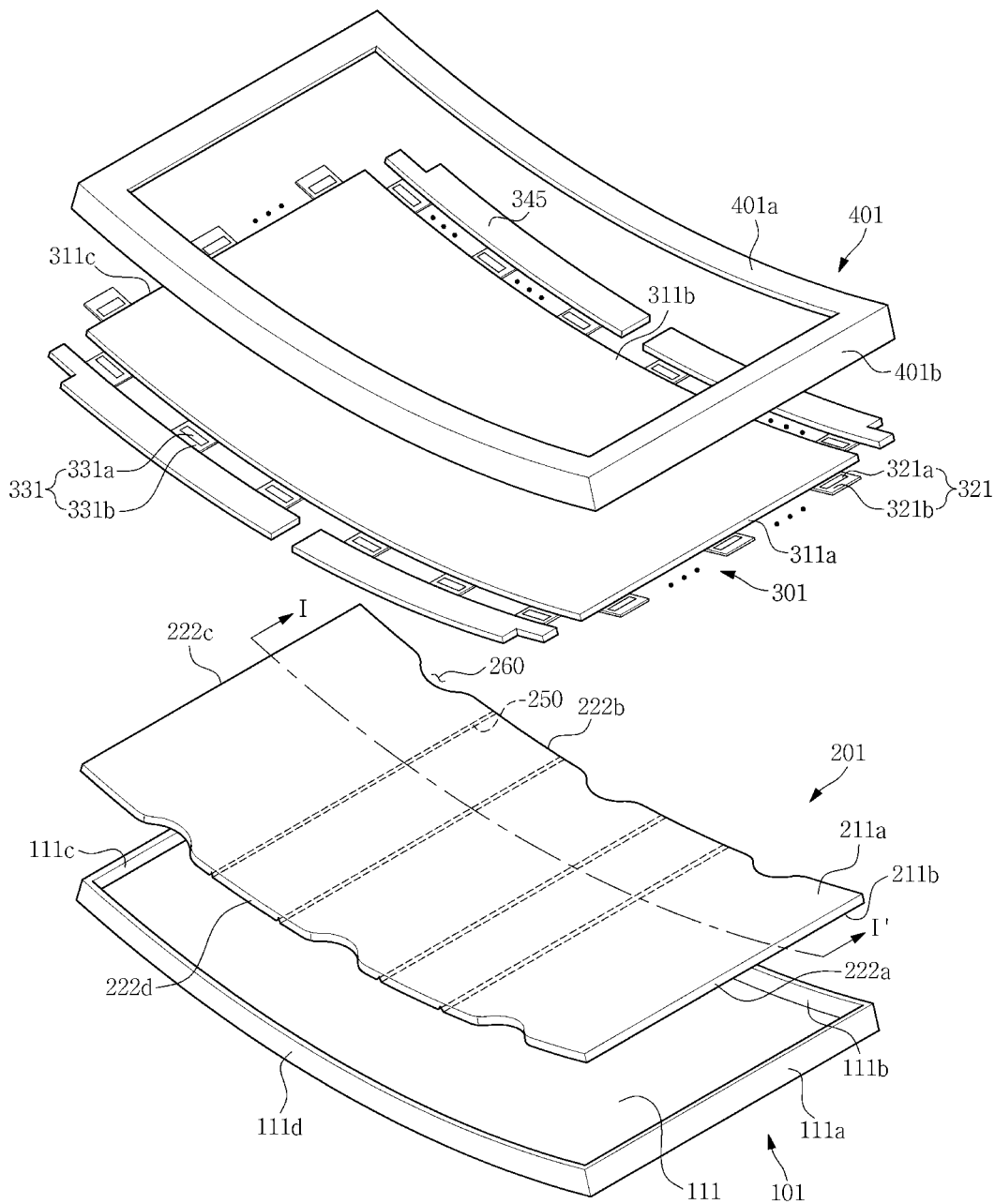
FIG. 1 is an exploded perspective view illustrating a display device according to an embodiment of the present invention.

Advantages and features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations and techniques are not described in detail in the embodiments in order to prevent the present invention from being obscurely interpreted. Like reference numerals refer to like elements throughout the specification.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

A curved display device includes a display panel and a heat dissipation plate having a curved shape corresponding to a shape of the curved display device.

In order for a heat dissipation plate to perform a heat dissipation function appropriately, an entire surface of the heat dissipation plate needs to be in contact with a display panel. However, it may be difficult for the heat dissipation plate to maintain a curved shape thereof due to a high level of brittleness of the heat dissipation plate. Accordingly, an issue of inaccurate contact between the heat dissipation plate and the display panel may arise.

Hereinafter, referring to FIGS. 1 through 5, a display device according to an embodiment of the present invention will be described. Meanwhile, all terminologies used herein are merely used to describe embodiments of the inventive concept and may be modified according to the relevant art and the intention of an applicant. Therefore, the terms used herein should be interpreted as having a meaning that is consistent with their meanings in the context of the present disclosure, and is not intended to limit the invention.

Figure 2:
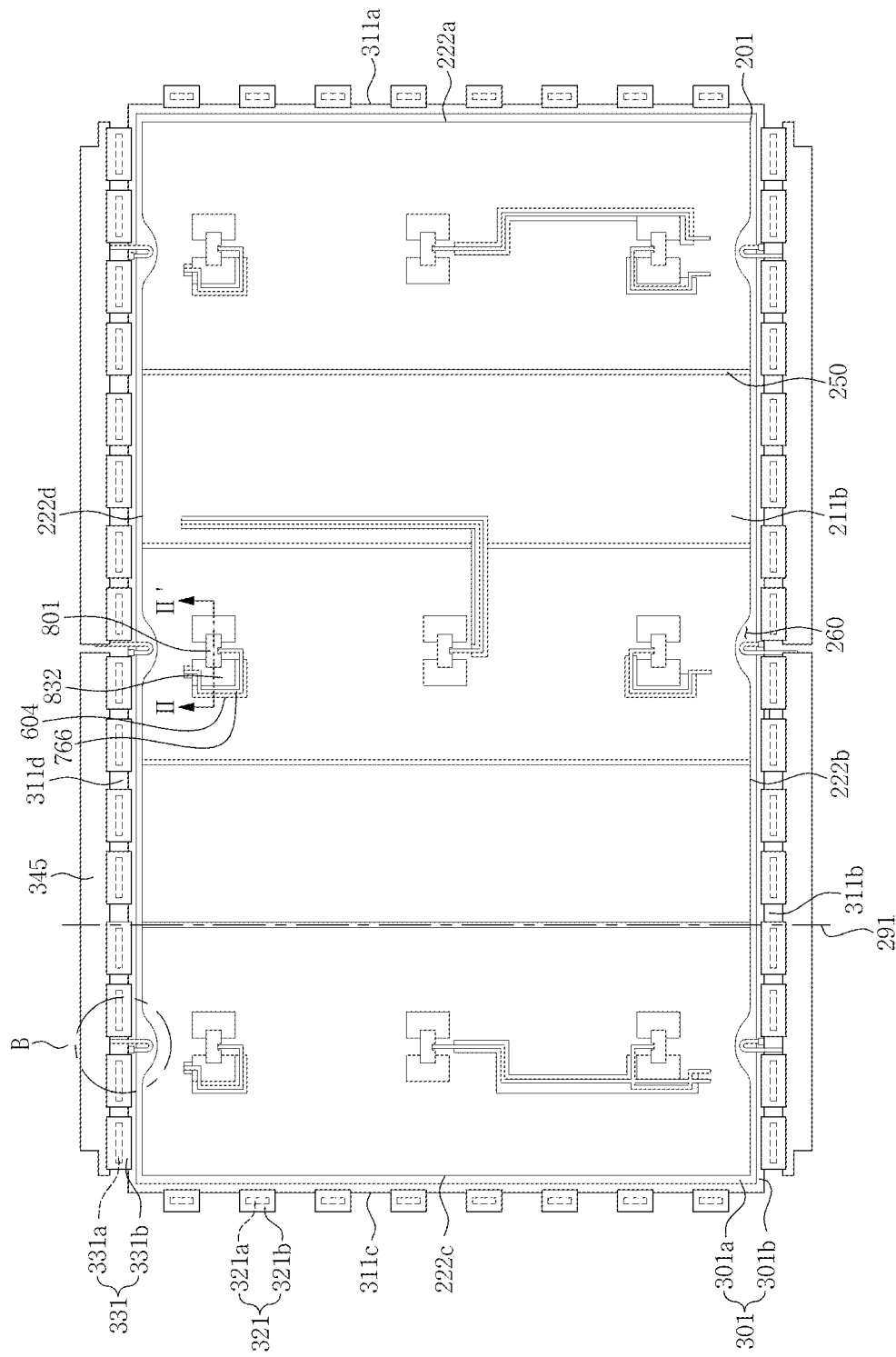
FIG. 2 is a plan view illustrating a heat dissipation plate and a display panel of FIG. 1.

FIG. 1 is an exploded perspective view illustrating a display device according to an embodiment of the present invention; and FIG. 2 is a plan view illustrating a heat dissipation plate and a display panel of FIG. 1.

The display device according to the embodiment of the present invention may be a curved display device having both ends positioned higher than a center of a display unit. For example, such a curved display device may have an arc-shaped cross section. In an embodiment, the curved display device has a concave or convex shape. Hereinafter, unless otherwise indicated, it may be appreciated that all elements used herein are formed of a flexible material.

The display device according to the embodiment, as illustrated in FIG. 1, may include a bottom case 101, a heat dissipation plate 201, a display panel 301, a top case 401, and a driving unit. In this instance, the driving unit may include a gate driver 321, a data driver 331, and one or more source printed circuit boards (PCBs) 345. The aforementioned elements may have a curved shape corresponding to a curved shape of the display device.

The bottom case 101 may have an accommodation space therein. The accommodation space may have the heat dissipation plate 201 and the display panel 301 disposed therein. In order to secure or provide the accommodation space, the bottom case 101 may include a base portion 111 and a four-sided rim which includes a plurality of side portions 111a, 111b, 111c, and 111d. For example, since the base portion 111 may have a quadrangular shape, the aforementioned side portions 111a, 111b, 111c, and 111d may protrude from respective edges of the base portion 111 to have a predetermined height. Edges of adjacent sides may be connected to one another. A space defined by being enclosed by the side portions 111a, 111b, 111c, and 111d and the base portion 111 may correspond to the accommodation space described above.

When the four side portions 111a, 111b, 111c, and 111d are defined as a first side portion 111a, a second side portion 111b, a third side portion 111c, and a fourth side portion 111d, the first and third side portions 111a and 111c opposite to one another may each have a linear shape whereas the second and fourth side portions 111b and 111d opposite to one another may each have a curved shape.

The base portion 111 may have a curved shape. For example, the base portion 111 may have an arc shape curved in a direction from the first side portion 111a toward the third side portion 111c.

The heat dissipation plate 201 and the display panel 301 may be disposed in the accommodation space of the bottom case 101. In this instance, the heat dissipation plate 201 may be disposed on the bottom case 101 and the display panel 301 may be disposed on the heat dissipation plate 201.

The display panel 301 may receive an image data signal from a system to thereby display an image on a curved display surface thereof. The display panel 301 may include four sides 311a, 311b, 311c, and 311d. When the four sides 311a, 311b, 311c, and 311d included in the display panel 301 are defined as a first side 311a, a second side 311b, a third side 311c, and a fourth side 311d, the first and third sides 311a and 311c opposite to one another may each have a linear shape whereas the second and fourth sides 311b and 311d opposite to one another may each have a curved shape.

The display panel 301, as illustrated in FIG. 2, may include a lower substrate 301a and an upper substrate 301b facing one another. A plurality of gate drivers 321 may be connected to edges of the upper substrate 301b corresponding to the first side 311a and the third side 311c. Each gate driver 321, as illustrated in FIG. 2, may include a gate driving integrated circuit (IC) 321a and a gate carrier 321b on which the gate driving IC 321a is mounted.

A plurality of data drivers 331 may be connected between an edge of the upper substrate 301b corresponding to the second side 311b and the source PCB 345. In addition, a plurality of data driver 331 may be connected between an edge of the upper substrate 301b corresponding to the fourth side 311d and another source PCB 345. Each data driver 331 may include a data driving IC 331a and a data carrier 331b on which the data driving IC 331a is mounted.

In embodiments, a display unit may be disposed between the lower substrate 301a and the upper substrate 301b, and the display unit may be driven by the gate driving unit 321 and the data driving unit 331. The display unit may include an array of organic light emitting diode (OLED) elements. Meanwhile, the display unit may include a liquid crystal in lieu of OLED elements.

Figure 3:
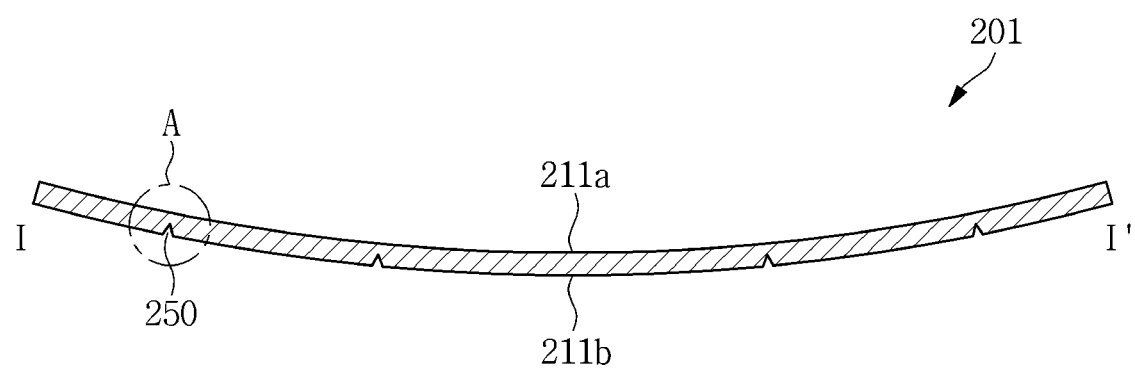
FIG. 3 is a cross-sectional view of the heat dissipation plate of FIG. 1 taken along line I-I'.
Figure 4:
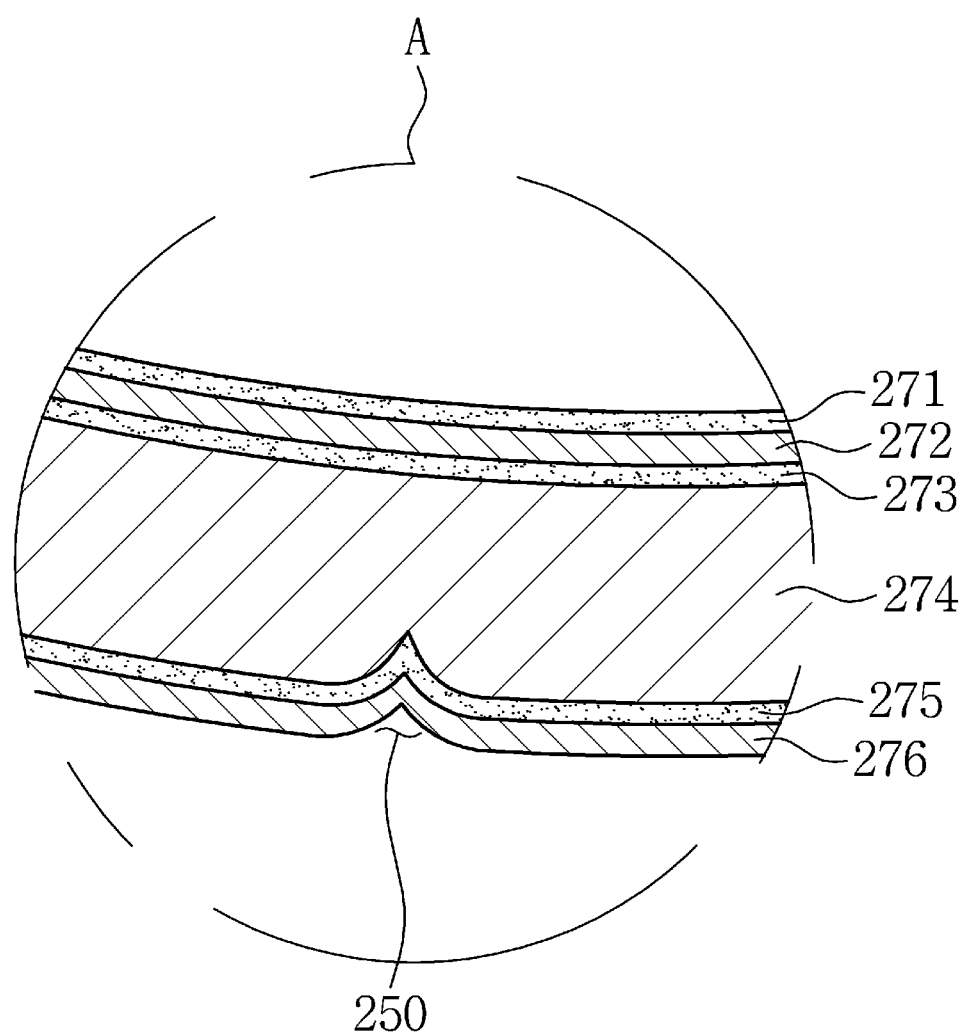
FIG. 4 is an enlarged view illustrating portion A of FIG. 3.

FIG. 3 is a cross-sectional view of the heat dissipation plate 201 of FIG. 1 taken along line I-I'; and FIG. 4 is an enlarged view illustrating portion A of FIG. 3.

The heat dissipation plate 201, as illustrated in FIG. 1, may be disposed between the bottom case 101 and the display panel 301. The heat dissipation plate 201, as illustrated in FIG. 2, may be in contact with the lower substrate 301a of the display panel 301. The heat dissipation plate 201 may release or radiate heat generated in the display panel 301 through the bottom case 101. In addition, when an excessive amount of heat is generated in a certain portion of the display panel 301, the heat dissipation plate 201 may disperse or transmit the excessive amount of heat to other portions of the display panel 301. For such heat dispersion, the display panel 301 may have an overall uniform temperature in all portions of the display panel 301. Accordingly, distortion in an image displayed in the predetermined portion of the display panel 301 due to the excessive amount of heat may be prevented.

The heat dissipation plate 201 may have a curved shape. The heat dissipation plate 201 may have four sides 222a, 222b, 222c, and 222d. The four sides 222a, 222b, 222c, and 222d included in the heat dissipation plate 201 may be defined as a first side 222a, a second side 222b, a third side 222c, and a fourth side 222d. In this instance, the first and third sides 222a and 222c opposite to one another may each have a linear shape whereas the second and fourth sides 222b and 222d opposite to one another may each have a curved shape.

In addition, the heat dissipation plate 201 may have two curved surfaces 211a and 211b. The two curved surfaces 211a and 211b may be defined as a front surface 211a and a rear surface 211b facing away from the front surface. The front surface 211a of the heat dissipation plate 201 faces the display panel 301. The rear surface 211b of the heat dissipation plate 201 faces the bottom case 101. The rear surface 211b of the heat dissipation plate 201 may have a greater radius of curvature than that of the front side 211a of the heat dissipation plate 201.

Further, the heat dissipation plate 201, as illustrated in FIGS. 1 through 4, may include one or more first grooves 250. For the first groove 250, the heat dissipation plate 201 may be relatively easily curved. Since the first groove 250 may be disposed at least one of the front surface 211a and the rear surface 211b of the heat dissipation plate 201, FIGS. 1 through 4 illustrate the first groove 250 as being disposed on the rear surface 211b, having a radius of curvature greater than that of the front surface. The first groove 250 may extend in a direction intersecting the curved side of the display panel 301. The aforementioned direction may be, for instance, a length or extending direction of a virtual line 291 intersecting the curved side of the display panel 301, and in this instance, the first groove 250 may be disposed along the virtual line 291. (See FIG. 2.) In detail, the virtual line 291 may intersect at least one of the second and fourth sides 311b and 311d of the display panel 301, and the first groove 250 may extend along the virtual line 291.

The first groove 250 may extend in a direction substantially perpendicular to the curved side of the display panel 301. For example, the aforementioned virtual line 291 may perpendicularly intersect the curved side of the display panel 301. Meanwhile, the virtual line 291 and the curved side may perpendicularly intersect, or may intersect at various angles rather than the right angle. FIGS. 1 and 2 illustrate an example in which the virtual line 291 and the curved sides 311b and 311d of the display panel 301 perpendicularly intersect. In embodiments, the first groove 291 may extend from the curved side 222b to the curved side 222d.

Meanwhile, the heat dissipation plate 201 may include a plurality of first grooves 250. As an example, the plurality of first grooves 250 may be disposed on only one of the front surface 211a and the rear surface 211b of the heat dissipation plate 201. In this instance, the plurality of first grooves 250 may all have the same length, or at least two of the plurality of first grooves 250 may have different lengths.

As another example, at least one of the plurality of first grooves 250 may be disposed on the front surface 211a of the heat dissipation plate 201, and the remainder thereof may be disposed on the rear surface 211b of the heat dissipation plate 201. In this instance, the first groove 250 disposed on the front surface 211a and the first groove 250 disposed on the rear surface 211b may be disposed to overlap one another, or alternatively, the first groove 250 disposed on the front surface 211a and the first groove 250 disposed on the rear surface 211b may be disposed not to overlap one another. In addition, the first grooves 250 disposed on the front surface 211a may all have the same length, or alternatively, at least two of the plurality of first grooves 250 disposed on the front surface 211a may have different lengths. Similarly, the first grooves 250 disposed on the rear surface 211b may all have the same length, or alternatively, at least two of the plurality of first grooves 250 disposed on the rear surface 211b may have different lengths. Further, a first groove 250 on the front surface 211a and a first groove 250 on the rear surface 211b overlapping the first groove 250 on the front surface 211a may have different lengths.

In embodiments, the first groove linearly extends along its extending direction substantially perpendicular to the curved side of the display panel. In embodiments, as shown in FIG. 1, the first groove has a length the same as the distance between two curved sides 222b and 222d of the heat dissipation plate. While extending in its extending direction, the first groove does not connect to any other groove extending in a direction different from the extending direction. In another embodiment, the first groove has a length which is a half of the distance between two curved sides 222b and 222d of the heat dissipation plate. In embodiments, the ratio of the length of the first groove with respect to the distance between two curved sides 222b and 222d of the heat dissipation plate is about 0.5, about 0.6, about 0.7, about 0.75, about 0.8, about 0.85, about 0.9, about 0.95 or 1.0. In an alternative embodiment, the ratio may be within a range defined by two of the foregoing ratios.

In embodiments, as shown in FIG. 1, the plurality of first grooves include innermost first grooves and outermost first grooves which are arranged symmetrically with respect to the heat dissipation plate's center line which extends from the curved side 222b to the curved side 222d and located in the middle of the non-curved side 222a and 222c. In embodiments, the number of first grooves located on the right side of the center line is the same as the number of first grooves located on the left side of the center line. Further, in embodiments, the innermost first groove and the outermost first groove disposed on either one of the left side and the right side of the center line are arranged such that a distance between the centerline and the innermost first groove is smaller than that between the outermost first groove and the non-curved side.

The first groove 250, as illustrated in FIG. 3, may have a V-shaped cross section. Meanwhile, in embodiments, the first groove 250 may have various shapes of cross section, such as an arc shape, a polygonal shape, a semi-circular shape, a semi-elliptical shape, or a parabola shape, in lieu of the V-shape.

Meanwhile, the heat dissipation plate 201, as illustrated in FIG. 4, may include an adhesive layer 271, a first protection layer 272, a first adhesive interlayer 273, a heat dissipation layer 274, a second adhesive interlayer 75, and a second protection layer 276.

The adhesive layer 271 may be disposed between the display panel 301 and the first protection layer 272. The adhesive layer 271 may serve to adhere or bond the lower substrate 301a of the display panel 301 to the first protection layer 272.

The first protection layer 272 may be disposed between the adhesive layer 271 and the first adhesive interlayer 273. The first protection layer 272 may serve to protect the heat dissipation layer 274.

The first adhesive interlayer 273 may be disposed between the first protection layer 272 and the heat dissipation layer 274. The first adhesive interlayer 273 may serve to adhere or bond the first protection layer 272 to the heat dissipation layer 274.

The heat dissipation layer 274 may be disposed between the first adhesive interlayer 273 and the second adhesive interlayer 275. The heat dissipation layer 274 may serve to disperse and externally release heat applied thereto. The heat dissipation layer 274 may be formed of graphite.

The second adhesive interlayer 275 may be disposed between the heat dissipation layer 274 and the second protection layer 276. The second adhesive interlayer 275 may serve to adhere or bond the second protection layer 276 to the heat dissipation layer 274. In the illustrated embodiment, a portion of the heat dissipation layer 274 under the first groove 250 may have a thickness smaller than that of other portions of the heat dissipation layer 274.

In addition, the heat dissipation layer 201, as illustrated in FIGS. 1 and 2, may include a second groove 260. The second groove 260 may be disposed at the curved side of the heat dissipation plate 201. For example, the second groove 260 may be disposed at the second and fourth sides 222b and 222d of the heat dissipation plate 201.

Figure 5:
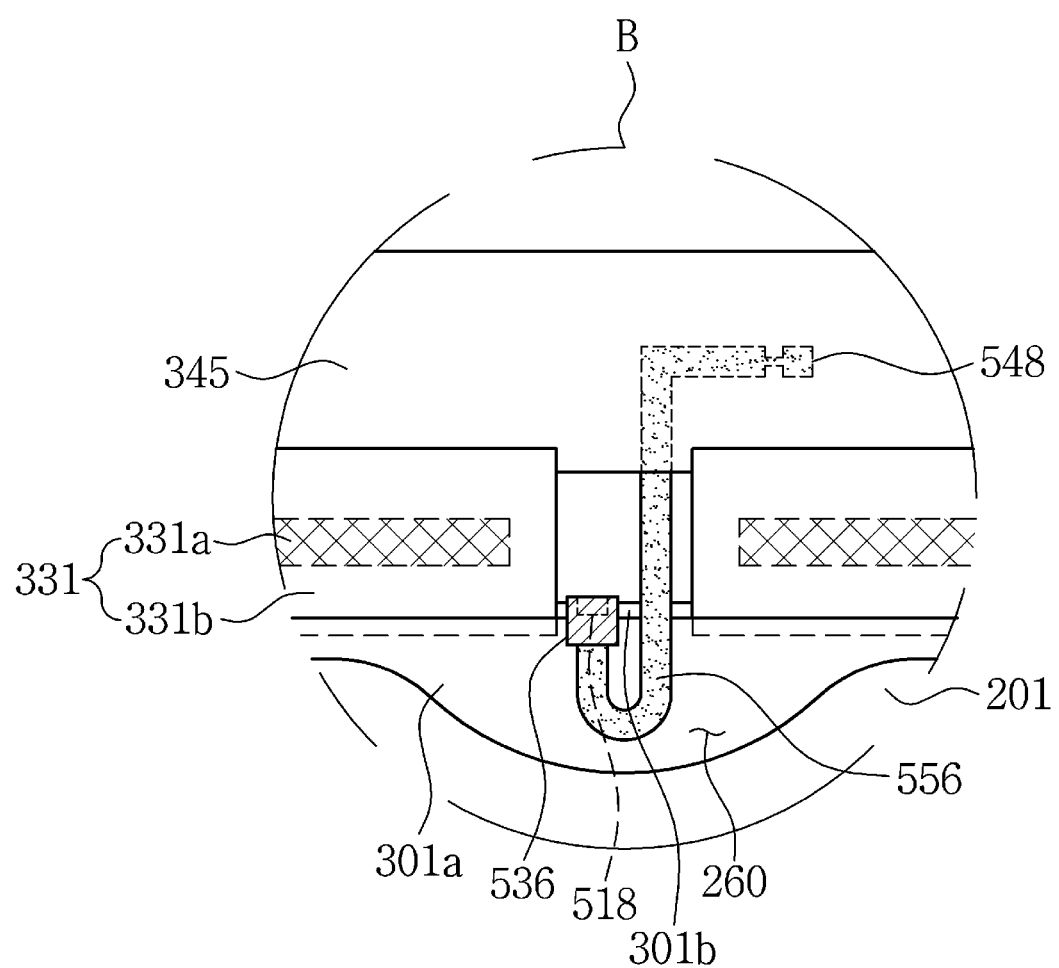
FIG. 5 is an enlarged view illustrating portion B of FIG. 2.

FIG. 5 is an enlarged view illustrating portion B of FIG. 2.

The display device, as illustrated in FIG. 5, may include a light detector 518 and a connector 556.

The light detector 518 may be disposed at the curved side of the display panel 301. For example, the light detector 518 may be disposed at the second and fourth sides 311b and 311d of the display panel 301. The light detector 518 may detect a luminance of light generated from the display panel 301. The light detector 518 may generate a light detection signal as a result of the detection, and may transmit the generated light detection signal to the source PCB 345 through the connection unit 556. The light detection signal transmitted to the source PCB 345 may be transmitted to a control PCB. Since the control PCB includes various driving circuits, such as a timing controller, disposed thereon, the light detection signal transmitted to the control PCB may be input to the timing controller. The timing controller may correct image data based on the light detection signal described above and a temperature detection signal which is to be described below. The corrected image data may be converted into an analog signal by the data driving ICs 331 to thereby be supplied to the display panel 301.

In embodiments, the light detector 518 may include a light detection circuit detecting light and a PCB on which the light detection circuit is mounted.

The light detector 518 may be disposed in a holder 536 having a C-shaped cross section. The holder 536 may fix the light detector 518 to the side of the display panel 301.

The connection unit 556 may transmit the light detection signal from the light detector 518 to the source PCB 345. A portion 548 of the connection unit 556 may be disposed in the second groove 260 of the heat dissipation plate 201. Examples of the connection unit 556 may include a flexible printed circuit (FPC) or a flexible flat cable (FFC).

The display panel 301, as illustrated in FIG. 2, may include one or more temperature detectors 801 and a signal transmission line 766. The temperature detector 801 may detect a temperature of the display panel 301 and the heat dissipation plate 201, and may generate a temperature detection signal as a result of the detection. The temperature detection signal may be applied to the source PCB 345 through the signal transmission line 766. The temperature detection signal applied to the source PCB 345 may be transmitted to the timing controller of the control PCB.

The temperature detector 801 and the signal transmission line 766 may be installed on the heat dissipation plate 201. A detailed description thereof will be provided with reference to FIGS. 2 and 7.

Figure 6:
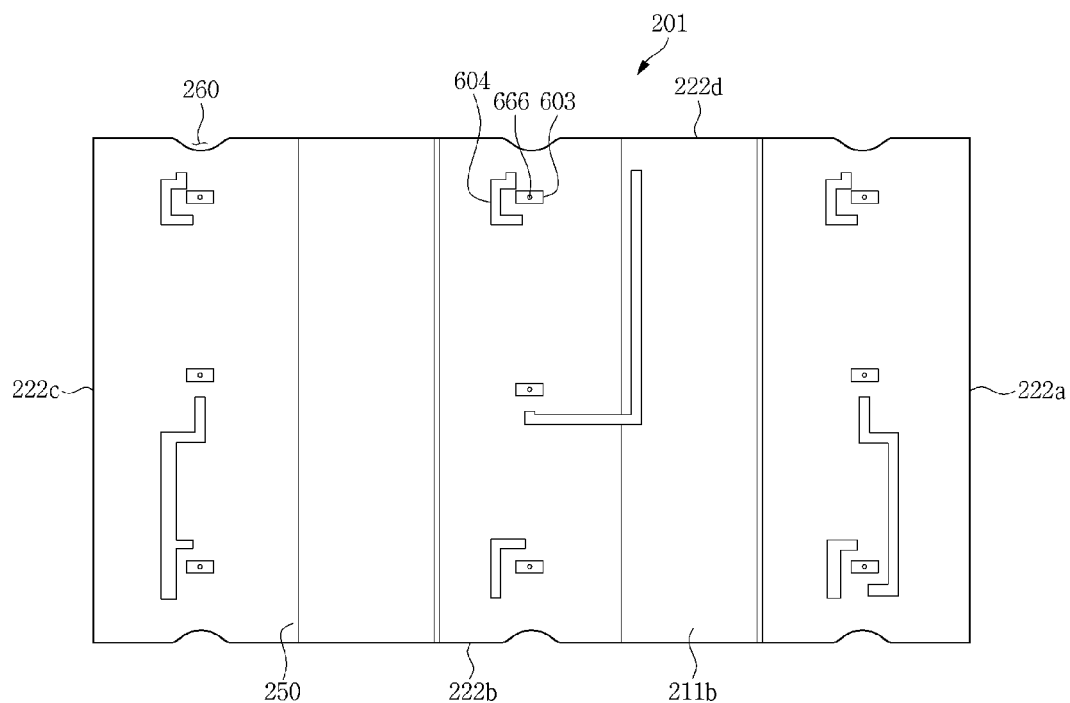
FIG. 6 is a view illustrating the heat dissipation plate of FIG. 2.
Figure 7:
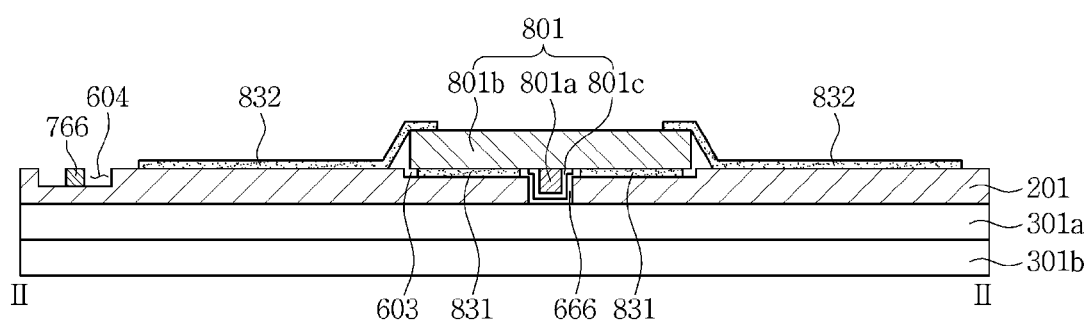
FIG. 7 is a cross-sectional view taken along line II-II' of FIG. 2.

FIG. 6 is a view illustrating the heat dissipation plate of FIG. 2; and FIG. 7 is a cross-sectional view taken along line II-II' of FIG. 2.

The heat dissipation plate 201, as illustrated in FIGS. 6 and 7, may include a third groove 603, a fourth groove 604, and a hole 666.

The third groove 603 and the fourth groove 604 may be disposed on the rear surface 211b of the heat dissipation plate 201. The hole 666 may be disposed in the third groove 603. The hole 666 may be formed through a portion of the heat dissipation plate 201 corresponding to a bottom surface of the third groove 603.

The third groove 603 and the first groove 250 may be disposed on the same surface of the heat dissipation plate 201, or alternatively, may be disposed on different surfaces.

The temperature detector 801 may be inserted into the third groove 603 and the hole 666. The temperature detector 801, as illustrated in FIG. 7, may include a temperature detection circuit 801a and a PCB 801b on which the temperature detection circuit 801a is mounted. Meanwhile, the temperature detector 801 may further include a protection layer 801c covering the temperature detection circuit 801a. The protection layer 801c may serve to prevent contact between the temperature detection circuit 801a and the heat dissipation plate 201 and prevent contact between the temperature detection circuit 801a and the display panel 301. The temperature detection circuit 801a and the protection layer 801c may be inserted into the hole 666, and the PCB 801b may be inserted into the third groove 603.

A first adhesive member 831 may further be disposed between the third groove 603 and the temperature detector 801. In detail, the first adhesive member 831 may be disposed between the bottom surface of the third groove 603 and the PCB 801b of the temperature detector facing the bottom surface of the third groove 603. Due to the first adhesive member 831, the temperature detector 801 may be fixedly inserted into the third groove 603. The first adhesive member 831 may be a double-sided tape.

Meanwhile, a second adhesive member 832 may further be used to fix the temperature detector 801. The second adhesive member 832 may be disposed on the temperature detector 801 and the rear surface 211b of the heat dissipation plate 201. For example, one end of the second adhesive member 832 may be disposed on the PCB 801b of the temperature detector 801, and the other end of the second adhesive member 832 may be disposed on the rear surface 211b of the heat dissipation plate 201. The second adhesive member 832 may be a tape having an adhesive formed on only one surface thereof.

The signal transmission line 766 may be inserted into the fourth groove 604. The signal transmission line 766 may connect the temperature detector 801 and the source PCB 345. In embodiments, connectors may be disposed on both end portions of the signal transmission line 766, and accordingly, one of the connectors may be connected to the PCB 801b of the temperature detector 801 and the other connector may be connected to the source PCB 345. In embodiments, the source PCB 345 may rotate based on an axis of the data carrier 331b to thereby be disposed on the heat dissipation plate 201, such that the connector of the source PCB 345 and the connector of the signal transmission line 766 may be connected to one another.

The fourth groove 604 and the first groove 250 may be disposed on the same surface of the heat dissipation plate 201, or alternatively, may be disposed on different surfaces of the heat dissipation plate 201.

As such, since the temperature detector 801 and the signal transmission line 766 are inserted into the groove of the heat dissipation plate 201, a thickness of the display device may be reduced.

A top case 401 may have a quadrangular frame shape only covering edge portions (non-display area) of a front surface of the display panel 301, that is, upper edge portions of the display panel 301. The top case 401 may cover the upper edge portions of the display panel 301 and the side portions 111a, 111b, 111c, and 111d of the bottom case 101. To this end, the top case 401 may include an upper cover 401a covering the upper edge portions of the display panel 301 and a side cover 401b covering the side portions 111a, 111b, 111c, and 111d of the bottom case 101.

As set forth above, according to embodiments, the display device may have the groove extending in the direction intersecting the curved side of the display panel. Accordingly, the heat dissipation plate may be relatively easily curved, such that the entire surface of the heat dissipation plate may be in contact with the display panel.

In addition, the temperature detector and the signal transmission line may be inserted into the groove of the heat dissipation plate. Accordingly, the thickness of the display device may be reduced.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A display device comprising:
   a display panel having a curved shape;
   a bottom case accommodating the display panel; and
   a heat dissipation plate disposed between the display panel and the bottom case, and comprising a first groove disposed on at least one surface of the heat dissipation plate and a second groove disposed at a curved side of the heat dissipation plate;
   a light detector disposed at the curved side of the display panel; and a connector interconnecting the light detector and a printed circuit board (PCB), the connector comprising a portion disposed in the second groove, wherein the first groove extends in an extending direction intersecting a curved side of the display panel.

2. The display device of claim 1, wherein the first groove extends in the direction which is substantially perpendicular to the curved side of the display panel.

3. The display device of claim 1, wherein the first groove is disposed on a one surface of the heat dissipation plate, the one surface having a radius greater than that of the other surface of the heat dissipation plate.

4. The display device of claim 1, wherein the heat dissipation plate comprises:
a first protection layer;
an adhesive layer disposed between the first protection layer and the display panel;
a second protection layer; and
a heat dissipation layer disposed between the second protection layer and the first protection layer.

5. The display device of claim 4, wherein the heat dissipation plate further comprises:
a first adhesive interlayer disposed between the first protection layer and the heat dissipation layer; and
a second adhesive interlayer disposed between the second protection layer and the heat dissipation layer.

6. The display device of claim 1, wherein the at least one first groove includes a one first groove on a one surface of the heat dissipation plate and another first groove on another surface of the heat dissipation plate, wherein the one first groove and another first groove overlap each other.

7. The display device of claim 1, wherein the at least one first groove linearly extends along the extending direction substantially perpendicular to the curved side of the display panel, wherein the at least one first groove extends throughout a distance between two curved sides of the heat dissipation plate without connection to any other first groove extending in a direction different from the extending direction.

8. The display device of claim 1, wherein the at least one first groove linearly extends along the extending direction substantially perpendicular to the curved side of the display panel, wherein the first groove has a length greater than about 75% of a distance between curved sides of the heat dissipation plate without connection to any other first groove extending in a direction different from the extending direction.

9. The display device of claim 1, wherein the width of the groove decreases with distance from the convex side.

10. A display device comprising:
a display panel having a curved shape;
a bottom case accommodating the display panel; and
a heat dissipation plate disposed between the display panel and the bottom case, and comprising a first groove disposed on at least one surface of the heat dissipation plate;
wherein the first groove extends in an extending direction intersecting a curved side of the display panel, and
wherein the heat dissipation plate further comprises:
a third groove disposed on at least one surface of the heat dissipation plate; and
a hole disposed in the third groove and penetrating through the heat dissipation plate.

11. The display device of claim 10, wherein the third and first grooves are disposed on the same surface of the heat dissipation plate.

12. The display device of claim 10, further comprising a temperature detector inserted into the third groove.

13. The display device of claim 12, further comprising a first adhesive member disposed between the third groove and the temperature detector.

14. The display device of claim 12, further comprising a second adhesive member disposed between the temperature detector and the heat dissipation plate.

15. The display device of claim 13, wherein the first adhesive member is a double-sided tape.

16. The display device of claim 14, wherein the second adhesive member is a tape.

17. The display device of claim 13, wherein the heat dissipation plate has a fourth groove disposed on at least one surface of the heat dissipation plate, wherein the display device further comprises a signal transmission line disposed in the fourth groove and interconnecting the temperature detector and the PCB.

18. The display device of claim 17, wherein the fourth groove and the first groove are disposed on the same surface of the heat dissipation plate.

19. The display device of claim 18, wherein the heat dissipation layer includes graphite.

* * * * *